United States Patent [19]

Lewis et al.

[11] Patent Number: 4,824,769
[45] Date of Patent: Apr. 25, 1989

[54] HIGH CONTRAST PHOTORESIST DEVELOPER

[75] Inventors: James M. Lewis, Williamsville; Robert A. Owens, East Amherst, both of N.Y.

[73] Assignee: Allied Corporation, Morris Township, Morris County, N.J.

[21] Appl. No.: 43,380

[22] Filed: Apr. 28, 1987

Related U.S. Application Data

[62] Division of Ser. No. 660,600, Oct. 15, 1984, Pat. No. 4,670,372.

[51] Int. Cl.$^4$ ............................................... G03C 5/24
[52] U.S. Cl. ................................... 430/331; 430/309; 430/326
[58] Field of Search ..................... 430/331, 326, 309; 252/174.21, 559, 174.23

[56] References Cited

U.S. PATENT DOCUMENTS

| | | |
|---|---|---|
| 2,183,853 | 12/1939 | Haussmann . |
| 3,586,504 | 6/1971 | Coates et al. ................. 430/331 |
| 3,741,911 | 6/1973 | Shane . |
| 3,819,538 | 6/1974 | Little ........................... 252/527 |
| 3,941,710 | 3/1976 | Gilbert et al. ................. 252/99 |
| 4,147,545 | 4/1979 | Rowe et al. .................. 430/331 |
| 4,223,163 | 9/1980 | Guilloty ....................... 568/618 |
| 4,350,756 | 9/1982 | Burch et al. ................. 430/331 |
| 4,378,423 | 3/1983 | Suezawa et al. ............. 430/331 |
| 4,443,353 | 4/1984 | Van Paassen ................ 252/103 |
| 4,467,027 | 8/1984 | Yamamoto et al. ........... 430/302 |

FOREIGN PATENT DOCUMENTS 0043132  1/1982  European Pat. Off. ............ 430/331

Primary Examiner—Paul R. Michl
Assistant Examiner—Patrick A. Doody
Attorney, Agent, or Firm—Felfe & Lynch

[57] ABSTRACT

A positive photoresist metal ion aqueous developer is provided that gives a high contrast to the photoresist.

The developer disclosed comprises a formulation of aqueous alkali-base such as potassium hydroxide and a carboxylated surfactant. The incorporation of the carboxylated surfactant provides the unexpected increase in the contrast of the photoresist. The addition of the carboxylated surfactant increases the gamma from a typical photoresist gamma ($\gamma$) of 3 or less to a gamma greater than 5.

The high contrast photoresist provides linewidth control and affords improved process latitude in photoresist imaging. The linewidth control is particularly critical in cases where fine lines are to be defined in the resist that covers steps of topography on the coated substrate. The higher the contrast, the less affected the resist by the topography, provided the exposure is adequate to expose the resist. The process latitude afforded by the high contrast is a result of the ability to over develop (develop longer) the exposed resist without affecting the unexposed resist in the adjacent areas.

5 Claims, 1 Drawing Sheet

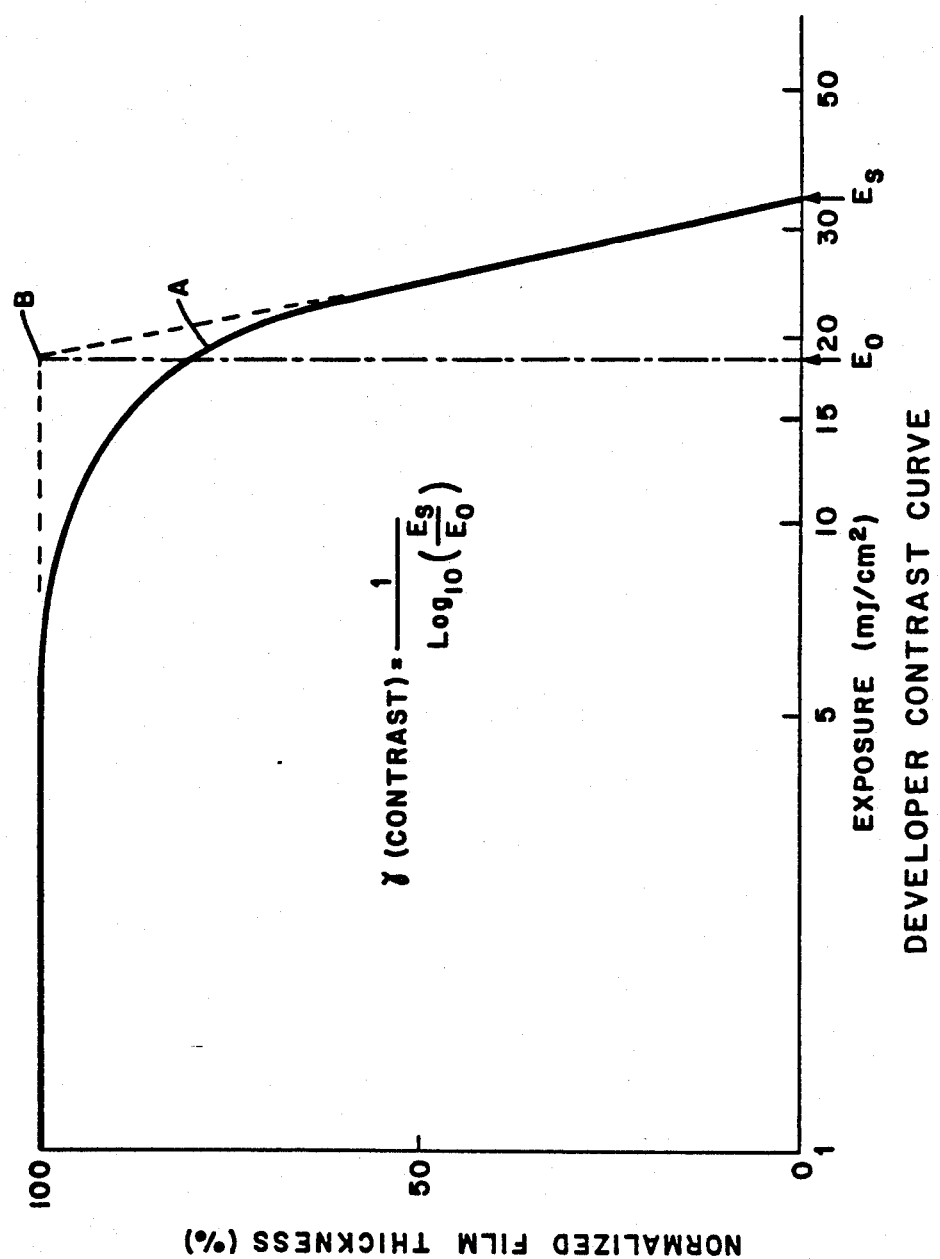

HIGH CONTRAST PHOTORESIST DEVELOPER

This is a divisional of U.S. Ser No. 660,600, filed Oct. 15, 1984, U.S. Pat. No. 4,670,372.

BACKGROUND OF THE INVENTION

1. Field of the Invention

This invention relates to a novel and improved developer for developing positive photoresists, and more particularly, to a developer used in the processing of alkali soluble resin/diazo ketone photoresists to increase the contrast of the developed photoresists. The invention is especially useful because it results in a higher contrast that renders the adverse effects from any exposure variations which occur less significant. In other words, the higher the contrast, the less affected are the geometry dimensions in the patterned photoresist by exposure variations; provided, of course, that the exposure is adequate to expose the photoresist. The developer of the invention affords a higher resolution capability of an order of one (1) micrometer on projection exposure tools where the image is somewhat defocused, i.e., the higher the contrast, the smaller the geometry dimensions can be patterned in the photoresist. In addition, the invention provides photoresist performance that is stable over the life of the developer bath when used as an immersion developer.

2. Description of the Prior Art

Photoresists are materials which change their solubility response to a developer solution after a film of the photoresist has been applied to a surface and exposed to an irradiation source, such as to ultraviolet light. As a consequence of the exposure, a different solubility rate results between the exposed and unexposed (masked over) portions of the photoresist film that yields a surface relief pattern after the development of the film. Those photoresists which become more soluble in the exposed regions are referred to as positive photoresists. However, because the alteration of the solubility of the photoresist is only a relative change and even the less soluble unexposed portions of the photoresist dissolve to some extent, any process, which enhances the developing rate difference (typically called contrast) between the relatively soluble and relatively insoluble photoresist portion is advantageous.

Positive photoresists are typically comprised of an aqueous alkaline soluble resin, such as novolak resin or poly(p-hydroxystyrene), and a diazonaphthoquinone sulfonic acid ester sensitizer. The resin and sensitizer may be applied by a method such as spin coating from an organic solvent or solvent mixture onto a substrate, such as silicon wafers and chrome plated glass plates. Developers that have been used to process the positive photoresists are aqueous alkaline solutions, such as sodium silicate, potassium hydroxide, sodium hydroxide, tetramethyl ammonium hydroxide and ammonium hydroxide. Various salts have been added to the developers. These salts include sodium phosphates, sodium borate, sodium carbonate and sodium silicate. The addition of the corresponding acid will generate the salt in the developer, so the sodium cation is not a specific requirement. The developer, as is known to those skilled in the art, removes the areas of the coated photoresist film that have been exposed to light or other form of irradiation so as to produce a pattern in the photoresist film.

The majority of existing positive photoresist systems can have a maximum contrast value (gamma) of three (3) to five (5) depending upon process conditions. The problems associated with a gamma of this order are evident in the reported performance. Typically gammas of this order are obtained by using a weak developer and a prolonged die developing with a resulting loss of throughput.

Gammas of greater than 5 have been achieved through the addition of certain surfactants to the developer. Quaternary ammonium surfactants increase the contrast of tetramethyl ammonium hydroxide developers, and fluorocarbon nonionic surfactants increase the contrast in alkaline hydroxide, i.e., NaOH and KOH, developers. These surfactants provide the high contrast, but the developer bath life is limited for repeated dip developing processes. Typically, the surfactant effect on contrast is greatly diminished after the first material has been developed with a resulting change in the exposure required. A positive photoresist metal ion aqueous base developer that gives high contrast, high sensitivity and a stable bath life is desirable. The gamma obtained should be greater than five (5); the sensitivity, better than 30 mJ/cm2; and the bath life, greater than 400 wafers developed per gallon of developer.

The high contrast provides linewidth control and process latitude in photoresist imaging. The high sensitivity allows for high throughput of wafers on the exposure tool. The long bath life provides a large number of substrates to be processed before changing the developer bath which reduces the cost of using the developer both in time and financially.

The line-width control is important in cases where fine lines are to be defined in the resist that covers steps or topography on the coated substrate. The linewidth of the patterned resist geometries change in dimension as the line crosses the step. The higher the contrast of the resist, the less the effect on dimensional changes crossing a step. The process latitude afforded by the high contrast is a result of the ability to over develop (develop longer) the exposed resist without affecting the unexposed resist in the adjacent areas. As a result, extremely small geometries of less than one micrometer can be patterned and the resist processing is less susceptible to changes in conditions, such as exposure.

The high sensitivity is important to the throughput of the patterning process. The shorter the exposure time required, the more substrates that can be processed through a given exposure tool in a given time. Also, the high sensitivity will allow setting the optics of the exposure tool to provide the best image quality. Finer lines can be patterned with smaller aperatures which reduces the exposure level without sacrificing the throughput of an exposure tool. This is critical in projection aligners that project the image through a lens system onto the substrate.

The reported high contrast developers change after the first batch of substrates is processed. The change is manifested as a change in sensitivity with the corresponding change in linewidth. The developers typically become faster and the space between the resist lines becomes larger. This change proves to be deterimental to the overall patterning process.

Accordingly a need exists for an improved high contrast photresist developer which obviates or substantially minimizes the above drawbacks.

SUMMARY OF THE INVENTION

The high contrast, sensitivity and bath life is obtainable in accordance with the invention by the addition of a carboxylated surfactant to an aqueous alkali metal base developer, preferably a potassium hydroxide or sodium hydroxide developer. The carboxylated surfactants contemplated by the invention are those encompassed within the formula:

$$R-O-(C_2H_4O)_n-CH_2-COOX$$

wherein R is a 6-18 carbon atom alkyl radical, n has a value of 1 to 24 and X is a cation such as K+, Na+ and H+. The incorporation of the carboxylated surfactant yields an unexpected and most practical improvement in the photoresist developer. The improvement in the contrast using the carboxylated surfacant modified developer of the invention, compared to the contrast obtained with developers with different surfactants or in which the carboxylated surfactant was omitted, was typically two fold and greater. The length of the bath life with the incorporation of the carboxylated surfactant in the developer represents a significant improvement over the bath life of other high contrast surfactant containing developer compositions. The high contrast developers in accordance with this invention do not change significantly as subsequent batches of substrates are developed; we have found that more than an equivalent of 400 silicon wafers 100 mm in diameter can be developed in four (4) liters of developer.

BRIEF DESCRIPTION OF THE DRAWING

The FIGURE of the drawing comprises a plot of the normalized film thickness remaining after the film has been developed versus the log of the exposure given the film as shown in Curve A.

DESCRIPTION OF THE PREFERRED EMBODIMENT

The photoresists employed with the developer of the present invention are those sensitizer-resin compositions in which the exposed portions of the composition becomes more soluble upon exposure.

Suitable sensitizers used in positive photoresists of this kind are diazo ketones having diazo and keto groups at adjacent positions on the molecule, such as the quinone-diazide sulfonic acid derivaties which are described in U.S. Pat. Nos. 2,958,599; 3,046,110; 3,046,114; 3,046,116; 3,046,118; 3,046,119; 3,046,121; 3,046,122; 3.046.123; 3,106,465; 3,148,983; 3,635,709; 3,711,285; 4,174,222 and which are hereby incorporated by reference. Examples of typical photosensitive compounds used in positive photoresists are shown in Table I.

TABLE I

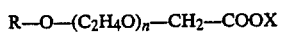  1

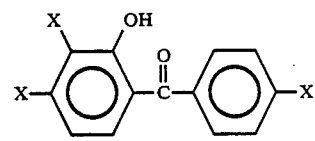  2

TABLE I-continued

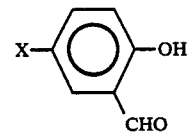  3

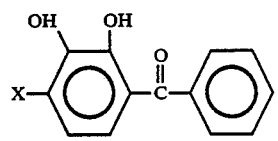  4

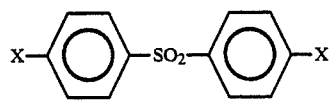  5

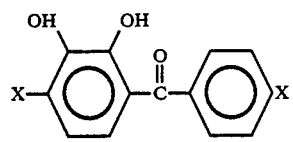  6

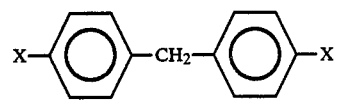  7

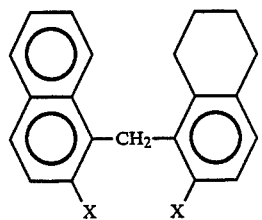  8

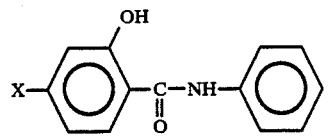  9

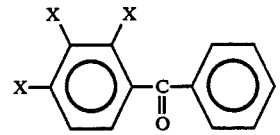  10

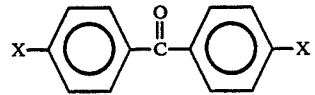  11

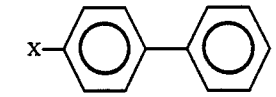  12

13

TABLE I-continued

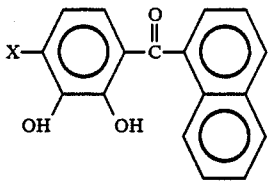

14

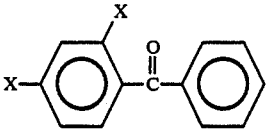

15

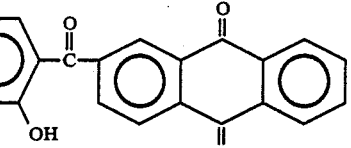

16

X—CH$_2$—CHBr—CH$_2$Br

Where X =

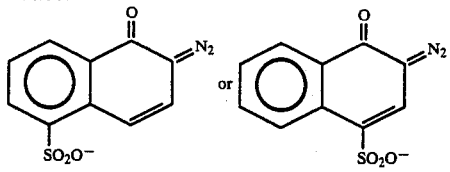

The photosensitizer acts to decrease the solubility of the resin. Upon irradiation, the photosensitizer undergoes a chemical reaction to form a carboxylic acid which increases the rate of solubilization of the photoresist in the exposed areas.

In general, photosensitizers which contain more than one diazonaphthoquinone group are preferred because they appear to provide higher contrast photoresists. Suitable alkali soluble resns may be employed in the positive photoresists. Those contemplated by this invention are the prepolymerized phenolic-aldehyde resins, e.g., phenol formaldehyde, which are known as novolaks and are available commercially. Resins of this kind are disclosed, for example, in U.S. Pat. Nos. 3,201,239; 3,868,254; 4,123,219 and 4,173,470, the disclosures of which are incorporated herein by reference. These phenolic-aldehyde resinous compounds must be soluble in organic solvents and aqueous alkaline solutions.

A number of phenolic compounds and aldehyde or aldehyde producing compounds will yield novolak resins through well-known syntheses. Phenolic compounds that may be used include, but not limited to, phenol, xylenol, cresol, resorcinol, napthol, hydroquinone, alkyl phenols and halogenated phenols. Illustrative of the aldehydes and aldehyde producing compounds that my be use, but not limited to, are formaldehyde, actaldehyde, paraformaldehyde, formaline, acrolein, crotonaldehyde and furfural.

In accordance with the invention, the addition of a carboxylated surfactant to the developer that comprises an aqueous alkali metal base, preferably potassium hydroxide, produced a substantial and unexpected improvement in contrast.

We have found, in accordance with the invention, that the addition of a carboxylated surfactant to the developer, that comprises an aqueous alkali metal base (preferably potassium hydroxide), produces a substantial and unexpected improvement in contrast without subsequent loss of developer bath life as evidenced by uniform exposure and dimemsion deviation. In addition to potassium hydroxide, other alkali bases such as sodium hydroxide, sodium silicate and lithium hydroxide, may be employed.

The surfactants producing this unexpected improvement are those characterized by the formula R—O—(C$_2$H$_4$O)$_n$—CH$_2$COOX; where R is a linear or branched hydrocarbon radical of 6 to 18 carbon atoms, n is an integer of 1 to 24; and X is H$^+$, Na$^+$, K$^+$ or other cations from a source that solubilizes in the alkaline base. R is preferably a linear chain of C$_{12}$ to C$_{15}$; n is preferably 5; and X is preferably a cation which is the same as that of the alkaline base, preferably potassium (K). Suitable examples of carboxylated surfactants including mixture thereof, are shown in Table II.

TABLE II

| Surfactant General Formula: R—O—(C$_2$H$_4$)$_n$—CH$_2$—COOX | | |
|---|---|---|
| Compound | R | n |
| 1 | C$_{13}$H$_{27}$ | 7 |
| 2 | C$_{12}$H$_{25}$ | 5 |
| 3 | C$_{15}$H$_{25}$ | 12 |
| 4 | C$_{13}$H$_{27}$ | 11 |
| 5 | C$_{13}$H$_{27}$ | 18 |
| 6 | C$_{16}$H$_{33}$ to C$_{18}$H$_{37}$ | 4 |
| 7 | C$_{16}$H$_{33}$ to C$_{18}$H$_{37}$ | 8 |
| 8 | C$_{16}$H$_{33}$ to C$_{18}$H$_{37}$ | 24 |
| 9 | C$_{18}$H$_{37}$ | 12 |
| 10 | C$_{16}$H$_{33}$ | 12 |
| 11 | i-C$_{18}$H$_{37}$ | 5 |
| 12 | i-C$_{18}$H$_{37}$ | 10 |
| 13 | C$_6$H$_{13}$ | 1 |
| 14 | C$_2$H$_5$ | 4 |
| 15 | C$_4$H$_9$ | 4 |

X = H, Na, K

In using a developer such as the potassium hydroxide developer without the carboxylated surfactants of the invention, or with surfactants other than the carboxylated surfactants of the invention, e.g., Aerosol OS in amounts based on the total weight of the composition of 0.005%, the contrasts were 2.2 and 2.6, respectively. With a carboxylated surfactant of the kind prescribed in according to the invention, the typical contrast was greater than 5. In using a developer such as the potassium hydroxide developer with fluorocarbon surfactants as disclosed in the copending U.S. patent application Ser. No. 505,571 filed on June 17, 1983, high contrast was achieved, but with short immersion bath life equivalent to less than 25 wafers of 100 mm diameter developed in one gallon of developer. With the carboxylated surfactants of this invention a bath life with a capacity equivalent to greater than 400 wafers of 100 mm diameter were developed in one gallon of developer with no significant loss of photoresist performance as evidenced by consistently high contrast, no change in line width deviation and no film loss.

The following procedure was generally followed for determining the contrast of a photoresist. The photoresist used in the comparison comprised a diazonaphthoquinone sulfonic acid ester photosensitizer. The photoresist coating was prepared by spin coating. The substrates were silicon wafers typical of those used in the manufacture of semiconductor devices. These wafers were subjected to a 300° C. dehydration bake followed by a precoating treatment with vapors of hexamethyldisilazane for 10 minutes at room temperature immediately prior to coating. The wafers were spun at a speed so as to provide a one (1) micrometer (μm) thick resist film. The coated wafers were baked at 90° C. for 30 minutes in a convection oven. After baking, the wafers were exposed through an Opto-Line step table resolution mask with windows of various optical density so as to provide various exposure levels on the same wafer. The incident exposure was such as to provide a range of exposure through a step tablet mask from no exposure to exposure sufficient for the resist to develop to the substrate. Other techniques can be employed by those skilled in the art to obtain areas or wafers of known exposure levels for the purpose of evaluation.

After exposure the resist is contacted with the developer composition of the invention by any suitable manner that is employed for known developers, such as immersion, spray and puddle techniques. The novel developer composition of the invention operates at a pH of at least 9 and preferably at a pH above about 10.5 and more preferably above 12. Following development, the workpiece may be rinsed with water and further processed in a conventional manner. The thickness of the photoresist remaining at the various exposure levels can be measured by any suitable method, such as interferometry, profilometry, and elipsometry.

A plot as shown in Curve A of the drawing was made of the film thickness remaining versus the log of the exposure level for each step. The contrast was determined from the curve as described above. In general, the higher the gamma, the better the performance of the resist/developer system. A preferred gamma value is that in excess of 4 and optimally a performance with gamma of the order of 6 or greater is desirable. The exposure may be expressed in any suitable unit of measure that is descriptive of radiation impinging on the resist such as millijoules per square centimeter (mJ/cm$^2$). The film thickness remaining is normalized to the thickness of the unexposed film before development. The contrast is expressed as the negative of the slope of the tangent to the curve over the straight line portion where film loss is occurring. The equation for calculating the gamma (γ) is:

$$\gamma = \frac{1}{\log_{10}\left(\frac{E_s}{E_o}\right)}$$

where $E_s$ is the exposure level at which the tangent to the curve, line $\overline{E_sB}$, intercepts the axis for no film remaining, and $E_o$ is the exposure at which the tangent to the curve, $\overline{E_sB}$, intercepts the full film thickness remaining (Point B), as shown on the drawing.

The following procedure was followed in order to determine the bath life of a dveloper solution. The photoresist used was a novolak resin with a diazonaphtoquinone sulfonic acid ester photosensitizer. The photoresist coating was prepared by spin coating. The substrates were silicon wafers typical of those used in the manufacture of semiconductor devices. These wafers were subjected to a 300° C. dehydration bake followed by a precoating treatment with vapors of hexamethyldisilazane for 10 minutes at room temperature immediately prior to coating. The wafers were spun at a speed so as to provide a one (1) micrometer (μm) thick resist film. The coated wafers were baked at 90° C. for 30 minutes in a convection oven. After baking the wafers were exposed through a photomask having line/space pairs of approximately two (2) micrometer line width. The incident exposure was such as to provide sufficient exposure to consistently clear the exposed photoresist areas to the substrate during developing. The line width of the cleared space as measured using a Nanometrics Nanoline Critical Dimension computer which is capable of measuring a 2 micrometer line with a precision of 0.05 micometers. The dimension of the space in the resist was compared to the window dimension on the photomask to determine the amount that the resist dimension differs from the actual mask dimension that was used to pattern the resist. This is done by subtracting the mask pattern dimension from the resist pattern dimension.

Two methods were used to monitor the bath life of the developer. In one method, the actual number of exposed wafers are processed in the developer, then the contrast, sesitivity and line width are measured on the wafers in each boat load of 25 wafers. The other method, an equivalent amount of exposed photoresist is added to the developer and the resist performance measured at given intervals. Both methods give equivalent results.

In the practice of the invention, amounts of carboxylated surfactant of from about 0.0001 percent to about 1.0 percent based on the weight of the developer may be used with advantage. The more effective level of the carboxylated surfactant ranges from 0.0005% to 0.5% by weight. The preferred range is 0.001 to 0.1%. The concentration of potassium hydroxide must be varied accordingly to maintain the sensitivity level. A concentration of potassim hydroxide from about 0.05 to 1.0 Normal may be used. The more effective concentration of potassium hydroxide ranges from 0.1 to 0.5 Normal. The more preferred range is 0.1 to 0.3 Normal. The greater the amount of the surfactant, the more concentrated the developer needs to be. The concentrations of potassium hydroxide and carboxylated surfactant should be varied accordingly to obtain the desired or maximum sensitivity and contrast for a given carboxylated surfactant and carboxylated surfactant concentration.

The alkali metal bases, in addition to KOH include NaOH, LiOH, sodium silicate and the like, including compounds which when dissolved in the aqueous developer are capable of providing the equivalent ionic basicity of potassium hydroxide. When using sodium silicate, for example, the ratio of Na$_2$O to SiO$_2$ is preferably from 1:1 to 3:1. The amount of alkali metal hydroxide, e.g., when using KOH, may vary from about 0.1% to about 10% and preferably in the range of 0.5% to 5%. The following examples are illustrative of the invention. The enumeration of details in the examples should not be interpreted as limitations except as may be expressed in the appended claims.

EXAMPLE 1

(Comparative)

A photoresist coating was prepared by spin coating a film from a solution of a novolak resin and the photosensitizer shown in formula 15 of Table I. The substrate are silicon wafers that had been subjected to a 300° C. dehydration bake for at least one minute on a hot plate, and then treated with hexamethyldisilazane vapors for 10 minutes at room temperature immediately prior to coating. The wafers were spun so as to provide a 1 micrometer (μm) thick film of the resin-photosensitive composition. The coated wafers were baked at 90° C. for 30 minutes in a forced air convection oven. After baking, the wafers were exposed to ultraviolet light through an Opto-Line step tablet resolution mask with windows of various optical density so as to provide various exposure levels on the same wafer. The incident exposure was such that a range of exposure from no exposure sufficient for the resist to develop to the substrate. A 0.20N aqueous potassium hydroxide developer solution was prepared. The coated substrates were immersion developed at 22° C. for 60 seconds in this developer solution. The workpiece was rinsed in deionized water and dried. The contrast and sensitivity data are shown in Table III.

EXAMPLE 2

(Comparative)

A 0.25N aqueous potassium hydroxide developer solution was prepared with 0.005% Aerosol OS (sodium isopropylnaphthalene sulfonate, a nonfluorinated surfactant available from American Cyanamid) added. Substrates were prepared as described in Example 1. The processed substrates were immersion developed at 22° C. for 60 seconds in this developer solution. The workpiece was rinsed with deionized water and dried. The contrast and sensitivity data are shown in Table III.

EXAMPLE 3

(Comparative)

A 0.20N aqueous sodium hydroxide developer solution was prepared. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 4

(Comparative)

A 0.18 molar sodium metasilicate and 0.10 molar sodium phosphate aqueous developer solution was prepared. Substrates were prepared as described in Example 1. The processed substrates were immersion developed at 22° C. for 60 seconds in this developer. The workpiece was rinsed in deionized water and dried. The contrast and sensitivity data are shown in Table III.

EXAMPLE 5

A 0.200N aqueous potassium hydroxide developer solution was prepared with 83 ppm of a surfactant of Formula 2 in Table II in which R is a linear hydrocarbon radical. Substrates were prepared as described in Example 1. The processed substrates were immersion developed at 22° C. for 60 seconds in this developer solution. The workpiece was rinsed in deionized water and dried. The contrast and sensitivity data are presented in Table III.

EXAMPLE 6

A 0.20 N aqueous sodium hydroxide developer solution was prepared with 83 ppm of the surfactant used in Example 5 added. Substrates were prepared as described in Example 1. The processed substrates are immersion developed at 22° C. for 60 seconds in this developer solution. The workpiece was rinsed in deionized water and dried. The contrast and sensitivity data are shown in Table III.

EXAMPLE 7

A 0.18 molar sodium metasilicate and 0.10 molar sodium phosphate aqueous developer solution was prepared with 83 ppm of the surfactant used in Example 5 added. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 8

A 0.20N aqueous potassium hydroxide developer solution was prepared with 80 ppm of a surfactant of Formula 2 in Table II in which R is a branched hydrocarbon radical. Substrates were prepared as described in Example 1. The processed substrates were immersion developed at 22° C. for 60 seconds in this developer solution. The workpiece was rinsed in deionized water and dried. The contrast and sensitivity data obtained are presented in Table III.

EXAMPLE 9

A 0.20N aqueous sodium hydroxide developer solution was prepared with 83 ppm of the surfactant used in Example 8. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 10

A 0.200N aqueous potassium hydroxide developer solution was prepared with 80 ppm of surfactant of Formula 14 in Table II. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 11

A 0.200N aqueous potassium hydroxide developer solution was prepared with 80 ppm of surfactant of Formula 15 in Table II. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 12

A 0.200N aqueous potassium hydroxide developer solution was prepared with 80 ppm of surfactant of Formula 5 in Table II. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 13

A 0.200N aqueous potassium hydroxide developer solution was prepared with 80 ppm of surfactant of Formula 11 in Table II. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 14
(Comparative)

A 0.126N aqueous sodium hydroxide and 0.271N sodium borate developer solution was prepared. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 15

A 0.126N aqueous sodium hydroxide and 0.271N sodium borate developer solution was prepared with 80 ppm of the surfactant in Example 5 added. Substrates were prepared as described in Example 1. The processed substrates were immersion developed at 22° C. for 60 seconds in this developer solution. The workpiece was rinsed in deionized water and dried. The contrast and sensitivity data are shown in Table III.

were processed in one (1) liter of this developer, then 0.5 gram of exposed photoresist was added to the developer. Four more wafers were developed, then another 0.5 gram of exposed photoresist was added to the developer. Four more wafers were developer in the developer. Each 0.5 gram of exposed resist is equivalent to the amount of resist introduced to the developer by developing fifty (50) exposed wafers.

The deviation of the dimension from the dimension on the photomask through the photoresist was exposed was measured. The results are shown in Table IV.

TABLE IV

|  | Sensitivity (mJ/cm2) | Contrast (gamma) | Dimension Deviation ($\mu$m) | Bath Use (wafers/4 1) |
|---|---|---|---|---|
| First Set | 28 | 6 | 0.1 | 16 |
| Second Set | 28 | 5 | 0.1 | 232 |
| Third Set | 28 | 4 | 0.1 | 448 |

EXAMPLE 17

A developer is prepared as in Example 5. Substrates are prepared as described in Example 16. Sixteen carriers of twenty-five wafers per carrier are developed sequentially in a bath containing four (4) liters of devel-

TABLE III

| Example | Base | Surfactant/Carbonate | Sens. (mJ/cm2) | Contrast (gamma) | Film Loss % |
|---|---|---|---|---|---|
| 1 | KOH | None | 20 | 2 | 3 |
| 2 | KOH | Sodium isopropyl Napthalene | 25 | 3 | 3 |
| 3 | NaOH | None | 14 | 1.5 | 8 |
| 4 | $Na_2SiO_3$/$Na_3PO_4$ | None | 22 | 1.5 | 3 |
| 5 | KOH | $R—O(C_2H_4O)_5—CH_2—COOH$ (R = linear $C_{12}H_{25}$ to $C_{15}H_{31}$) | 25 | 7 | 0 |
| 6 | NaOH | Same as Example 5 | 18 | 6 | 0 |
| 7 | $Na_2SiO_3$/$Na_3/PO_4$ | Same Example 5 | 25 | 5 | 0 |
| 8 | KOH | $R—O—(C_2H_4O)_5—CH_2—COOH$ (R = branched $C_{12}H_{25}$ to $C_{15}H_{31}$) | 35 | 8 | 0 |
| 9 | NaOH | See Example 8 | 18 | 6 | 0 |
| 10 | KOH | $C_2H_5—O—(C_2H_4O)_4—COOH$ | 100 | >10 | 0 |
| 11 | KOH | $C_4H_9—O—(C_2H_4O)_4—COOH$ | 100 | >10 | 0 |
| 12 | KOH | $C_{13}H_{27}—O—(C_2H_4O)_{18}—COOH$ | 50 | >10 | 0 |
| 13 | KOH | $(i-C_{18}H_{37})—O—(C_2H_4O)_5—COOH$ | 32 | 10 | 0 |
| 14 | NaOH/$Na_3BO_3$ | None | 22 | 2 | 1 |
| 15 | NaOH/$Na_3BO_3$ | See Example 5 | 30 | 4 | 0 |

EXAMPLE 16

A developer was prepared as in Example 5. A photoresist coating was prepared by spin coating a film from a solution of a novolak resin and the photosensitizer shown in formula 15 of Table I. The substrate was a silicon wafer that had been subjected to a 300° C. dehydration bake for at least one minute on a hot plate, and then treated with hexamethyldisilazane vapors for 10 minutes at room temperature immediately prior to coating. The wafers were spun so as to provide a 1 micrometer thick film. The coated wafers were baked at 90° C. for 30 minutes in a forced air convection oven. After baking, the wafers were exposed to ultraviolet light through a photomask having line/space pairs of approximately two (2) micrometer line width. The incident exposure was 28 mJ/cm2 such as to provide sufficient exposure to consistently clear the exposed photoresist areas to the substrate during developing. Four wafers oper. The results are given in Table V.

TABLE V

| Carrier # | Sensitivity (mJ/cm2) | Contrast (gamma) | Dimension Deviation ($\mu$m) | Bath Use (wafers/4 1) |
|---|---|---|---|---|
| 1 | 28 | 6 | 0.1 | 25 |
| 2 | 28 | 6 | 0.1 | 50 |
| 3 | 28 | 6 | 0.1 | 75 |
| 4 | 28 | 6 | 0.1 | 100 |
| 5 | 28 | 6 | 0.1 | 125 |
| 6 | 28 | 6 | 0.1 | 150 |
| 7 | 28 | 6 | 0.1 | 175 |
| 8 | 28 | 5 | 0.1 | 200 |
| 9 | 28 | 5 | 0.1 | 225 |
| 10 | 28 | 5 | 0.1 | 250 |
| 11 | 28 | 5 | 0.1 | 275 |
| 12 | 28 | 5 | 0.1 | 300 |
| 13 | 28 | 5 | 0.1 | 325 |
| 14 | 28 | 5 | 0.1 | 350 |

TABLE V-continued

| Carrier # | Sensitivity (mJ/cm2) | Contrast (gamma) | Dimension Deviation (μm) | Bath Use (wafers/4 l) |
|---|---|---|---|---|
| 15 | 28 | 4 | 0.1 | 375 |
| 16 | 28 | 4 | 0.1 | 400 |

While the invention has been described with reference to positive photoresists sensitive to ultraviolet light (290-500 nm), the novel developer is applicable also to positive electron beam, x-ray, ion beam, deep ultraviolet (220-290 nm) light and other radiation sensitive resists.

This invention has been particularly described with reference to preferred embodiments thereof; it will be understood by those skilled in the art, however, that changes in form and details may be made therein without departing from the spirit and scope of the invention.

What is claimed:

1. A developer for radiation sensitive film consisting essentially of:
   (a) an aqueous alkali metal base;
   (b) water; and
   (c) 0.0001 to 1.0 percent based on the total weight of a carboxylated surfactant of the formula:

$$R-O-(C_2H_4O)_n-CH_2COOX$$

wherein R is selected from the group consisting of linear or branched hydrocarbons of 6-18 carbon atoms, n is an integer of 1 to 24 and X is a cation selected from $K^+$, $Na^+$ and $H^+$.

2. The developer of claim 1 wherein (a) is selected from the group consisting of potassium hydroxide and sodium hydroxide, and (c) is present in amounts of from about 0.001 percent to about 0.1 percent.

3. A developer composition for developing an exposed photosensitive resin film applied on a substrate to form a semiconductor device which composition consists essentially of an aqueous solution containing sufficient alkali metal hydroxide to impart a pH above about 10.5 and containing from about 0.0001 to about 1.000 percent of surfactant of the formula:

$$R-O-(C_2H_4)_n-CH_2COOX$$

wherein R is selected from the group consisting of linear or branched hydrocarbons of 6-18 carbon atoms, n is an integer of 1 to 24 and X is cation selected from $K^+$, $Na^+$ and $H^+$.

4. A composition of claim 3 wherein the alkali metal hydroxide is potassium hydroxide.

5. The developer of claim 1 wherein (a) is selected from the group consisting of potassium hydroxide and sodium hydroxide, and (c) is present in amounts of from about 0.0005 percent to about 0.5 percent.

* * * * *

UNITED STATES PATENT AND TRADEMARK OFFICE
CERTIFICATE OF CORRECTION

PATENT NO.  :   4,824,769
DATED       :   April 25, 1989
INVENTOR(S) :   James M. Lewis et al It is certified that error appears in the above-identified patent and that said Letters Patent is hereby corrected as shown below:

Cover page [73] "Allied Corporation, Morris Township, Morris County, N.J." should read --Petrarch Systems, Inc. Bristol, PA--;

Column 5, line 41, "resns" should read --resins--;

Column 7, line 55, "dveloper" should read --developer--.

Signed and Sealed this

Tenth Day of April, 1990

Attest:

HARRY F. MANBECK, JR.

*Attesting Officer*          *Commissioner of Patents and Trademarks*